(12) United States Patent
Morris et al.

(10) Patent No.: US 6,230,497 B1
(45) Date of Patent: May 15, 2001

(54) SEMICONDUCTOR CIRCUIT TEMPERATURE MONITORING AND CONTROLLING APPARATUS AND METHOD

(75) Inventors: Garron K. Morris, Niskayuna, NY (US); Debabrata Pal, Schaumburg; Martin R. Pais, North Barrington, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/455,549

(22) Filed: Dec. 6, 1999

(51) Int. Cl.[7] .................................................. F25B 21/02
(52) U.S. Cl. ............................... 62/3.7; 62/3.3; 62/259.2
(58) Field of Search ............................. 62/3.3, 3.7, 259.2

(56) References Cited

U.S. PATENT DOCUMENTS

| | | | | |
|---|---|---|---|---|
| 4,582,985 | * | 4/1986 | Lofberg | 235/380 |
| 4,935,864 | * | 6/1990 | Schmidt et al. | 363/141 |
| 5,444,637 | * | 8/1995 | Smesny et al. | 364/556 |
| 5,894,056 | * | 4/1999 | Kakizaki et al. | 430/5 |
| 5,918,469 | * | 7/1999 | Cardella | 62/3.7 |
| 5,940,784 | * | 8/1999 | El-Husayni | 702/130 |
| 6,028,263 | * | 2/2000 | Kobayashi et al. | 136/201 |
| 6,080,969 | * | 7/2000 | Goto et al. | 219/444.1 |
| 6,088,662 | * | 7/2000 | Flinsbaugh et al. | 702/132 |

* cited by examiner

*Primary Examiner*—William Doerrler
*Assistant Examiner*—Mark Shulman
(74) *Attorney, Agent, or Firm*—Heather L. Mansfield; Lalita P. Williams

(57) ABSTRACT

A method and apparatus for monitoring and controlling temperatures at a semiconductor circuit (22) by an array (32) of thermoelectric cooler cells (34) which are disposed proximate the semiconductor circuit (22). At least one thermoelectric cooler (38) is located at the individual thermoelectric cooler cells (34) for removing and adding heat from cell areas associated with the thermoelectric coolers. A memory device (50) is associated with the cooler cells (34) and stores operational settings for the cooler cells. A controller (28) is coupled with the thermoelectric cooler cells (34) to individually control the operational settings for the cooler cells in the array (32).

33 Claims, 4 Drawing Sheets

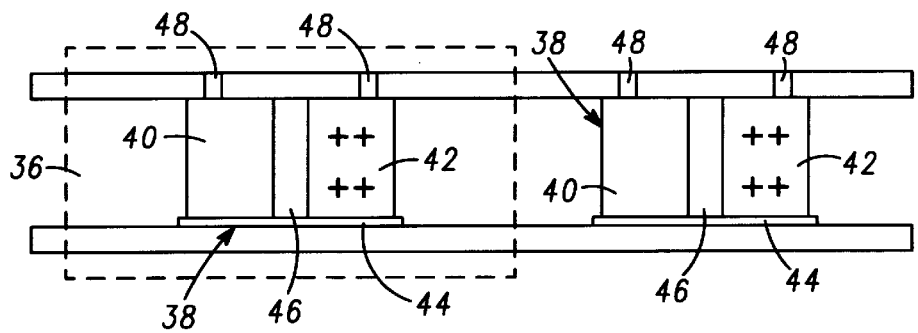
FIG. 3
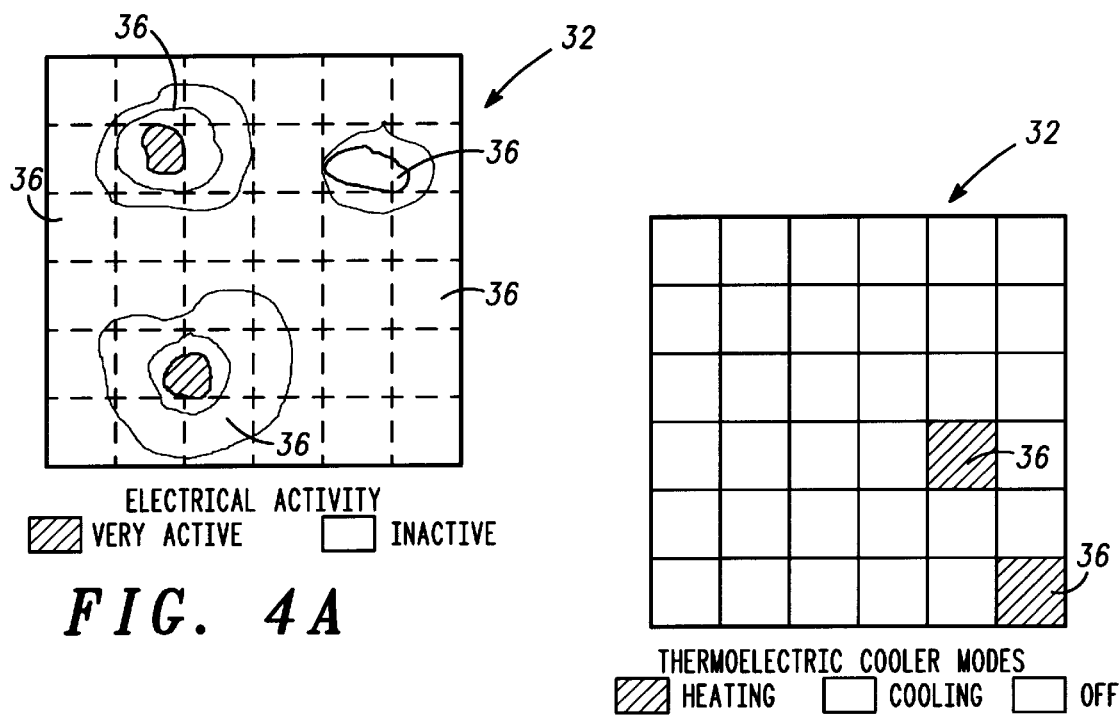
FIG. 4A
FIG. 4B
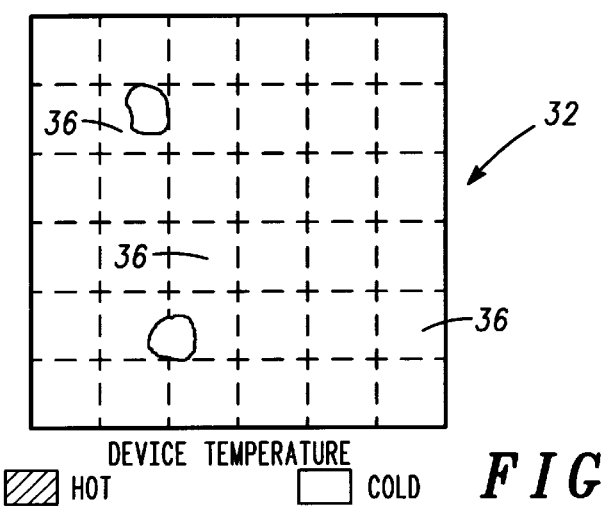
FIG. 4C

SEMICONDUCTOR CIRCUIT TEMPERATURE MONITORING AND CONTROLLING APPARATUS AND METHOD

FIELD OF THE INVENTION

The present invention relates generally to integrated circuit multi-chip modules and, in particular, to thermal management techniques and devices for cooling multi-chip modules.

BACKGROUND OF THE INVENTION

Recent trends in the electronics industry have been toward increased integration in the form of multi-chip modules and software-controlled power management. Conventional thermal management techniques rely on spreading the heat generated in the active areas of the device and ultimately rejecting it to the environment via a heat sink. The shortcoming of this spreading technique is apparent with multi-chip modules: while temperatures of the active areas are reduced, the spreading causes inactive areas of the device to heat up along with severe temperature gradients. Ideally, the device should maintain a uniform temperature, independent of local activity. Reducing temperature gradients by locally cooling active or heating inactive areas in the device to a uniform temperature would reduce stresses and increase reliability.

New developments in VLSI integration have lead to a family of Field Programmable Gate Array (FPGA) chips with thousands of high-speed configurable switches (cells) that are capable of unlimited programmability. The setting of each switch is controlled by bits of high-speed RAM spread throughout the chip that has a toggle rate on the order of 220 MHz. By linking the FPGA with an external microprocessor or controller, functions may be implemented that are normally placed on an ASIC. The distinct advantage that FPGAs have over ASICs, is that FPGAs may be quickly reprogrammed. This programmability may be further exploited by coupling the FPGA with a genetic algorithm allowing circuit functionality to "evolve" directly on the FPGA in real time without having to rely on idealized computer simulations of the desired circuit. This approach to circuit design results in efficient electronic circuits that exploit the natural properties of silicon. However, evolved circuits on FPGAs perform satisfactorily only within ±5° C. of the temperature at which the circuit evolution took place. As the temperature increases or decreases beyond this range, the circuit performance significantly degrades. Hence, there is a clear problem with evolutionary hardware: how to evolve a circuit from processes that generate unequal heat and thus vary with temperature, such that the circuit can perform adequately over a wider range of temperatures.

Similar thermal management problems arise for sensors and other temperature-sensitive devices that must maintain precise temperatures in the presence of changing external fields and environments. These devices include: infrared detectors, gyros and accelerometers, photoresistors for IR spectroscopy, CCD devices, and laser and light-emitting diodes. Thus, there is a need in the art for maintaining uniform temperatures on electronic devices in the presence of changing internal or external temperature fields.

BRIEF DESCRIPTION OF THE DRAWINGS

FIG. 3 depicts a side view of thermoelectric coolers of the thermoelectric cooler cells of FIG. 2 in accordance with the present invention.

FIG. 4A illustratively depicts an example of electrical activity at the semiconductor device in relation to cell areas of the array.

FIG. 4B illustratively depicts thermoelectric cooler setting modes for cell areas of the array for the example of FIG. 4A.

FIG. 4C illustratively depicts subsequent semiconductor device temperature for the cell areas of the array.

DETAILED DESCRIPTION OF THE DRAWINGS

Stated generally, a method and apparatus for monitoring and controlling temperatures at a semiconductor circuit is provided in which an array of thermoelectric cooler cells is disposed proximate the semiconductor circuit. The array of individually-controlled thermoelectric cooler cells have associated thermoelectric coolers which are, in a preferred embodiment, integrated with and co-located on the device dice of the semiconductor based circuit. The thermoelectric coolers are made of semiconductor materials with current flow dictating temperature heating or cooling at the thermoelectric coolers. By changing the direction of the current, individual thermoelectric coolers effectively remove heat from or add heat to cell areas of the array. A controller receives temperature measurements from the thermoelectric cooler cells and individually controls the operational settings for the thermoelectric cooler cells of the array.

The present invention encompasses a method of monitoring and controlling temperatures at a semiconductor circuit. The method comprises the steps of positioning an array of thermoelectric cooler cells proximate the semiconductor circuit and providing the array with thermoelectric coolers such that a thermoelectric cooler cell has an associated thermoelectric cooler for selectively removing and adding heat from individual cell areas associated with the thermoelectric cooler cells. The operational settings for the thermoelectric cooler cells of the array are controlled to selectively add and remove heat from the individual cell areas.

An apparatus for monitoring and controlling temperatures at a semiconductor device is also provided which includes an array of thermoelectric cooler cells disposed proximate the semiconductor circuit. The apparatus includes a plurality of thermoelectric coolers with at least one thermoelectric cooler located at individual ones of the thermoelectric cooler cells for selectively removing and adding heat from a cell area associated with the thermoelectric cooler. A memory device associated with the thermoelectric cooler cells is provided for storing operational settings for the thermoelectric cooler cells. A controller coupled with the thermoelectric coolers is provided for individually controlling the operational settings for the thermoelectric cooler cells of the array.

Figure 1:
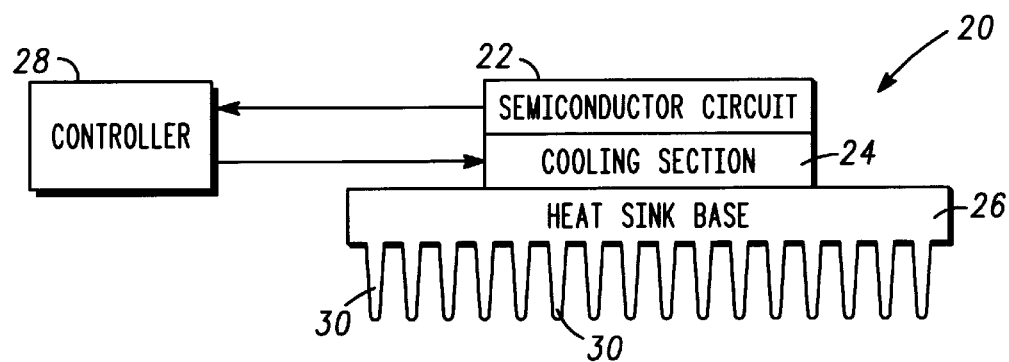
FIG. 1 is a block diagram which depicts an apparatus for monitoring and controlling temperatures at a semiconductor device in accordance with the invention.

FIG. 1 is a block diagram which generally depicts an apparatus 20 for monitoring and controlling temperatures at a semiconductor circuit 22. As shown in FIG. 1, the apparatus has a cooling section 24 which is coupled to a controller 28. The semiconductor device is also shown attached to a heat sink base 26 and fins 30. As will be explained in greater detail in FIGS. 2 and 3, the cooling section 24 establishes an array of thermoelectric cooler cells which are disposed proximate the semiconductor circuit 22. The cooling section 24 has a grid of thermoelectric coolers preferably integrated with and co-located on the device dice of the semiconductor based circuit 22.

The controller 28 as shown in FIG. 1 may selectively be an external microprocessor which communicates with both the semiconductor circuit 22 and the cooling section 24 to individually control and determine appropriate stored operational settings associated with the thermoelectric cells. The cooling section 24 may selectively include a temperature sensing element for monitoring local temperatures at respective thermoelectric cells, a memory device for storing the operational settings of individuals cells, and high speed switches for each cell to alter current flow in the cell thereby selectively removing heat or adding heat to the cell areas associated with the thermoelectric coolers of the cooling section. The controller 28 shown as an external microprocessor is coupled with the temperature-sensing elements, memory devices and high speed switches associated with each individual thermoelectric cooler cell to control the operational settings and, in turn, the temperature at the thermoelectric cooler cells proximate the semiconductor circuit 22. The semiconductor circuit may selectively be any electronic semiconductor based device such as an integrated circuit, Field Programmable Gate Array Chip memory devices, microprocessor, application specific integrated circuits, programmable logic devices, digital signal processing integrated circuits and the like.

Figure 2:
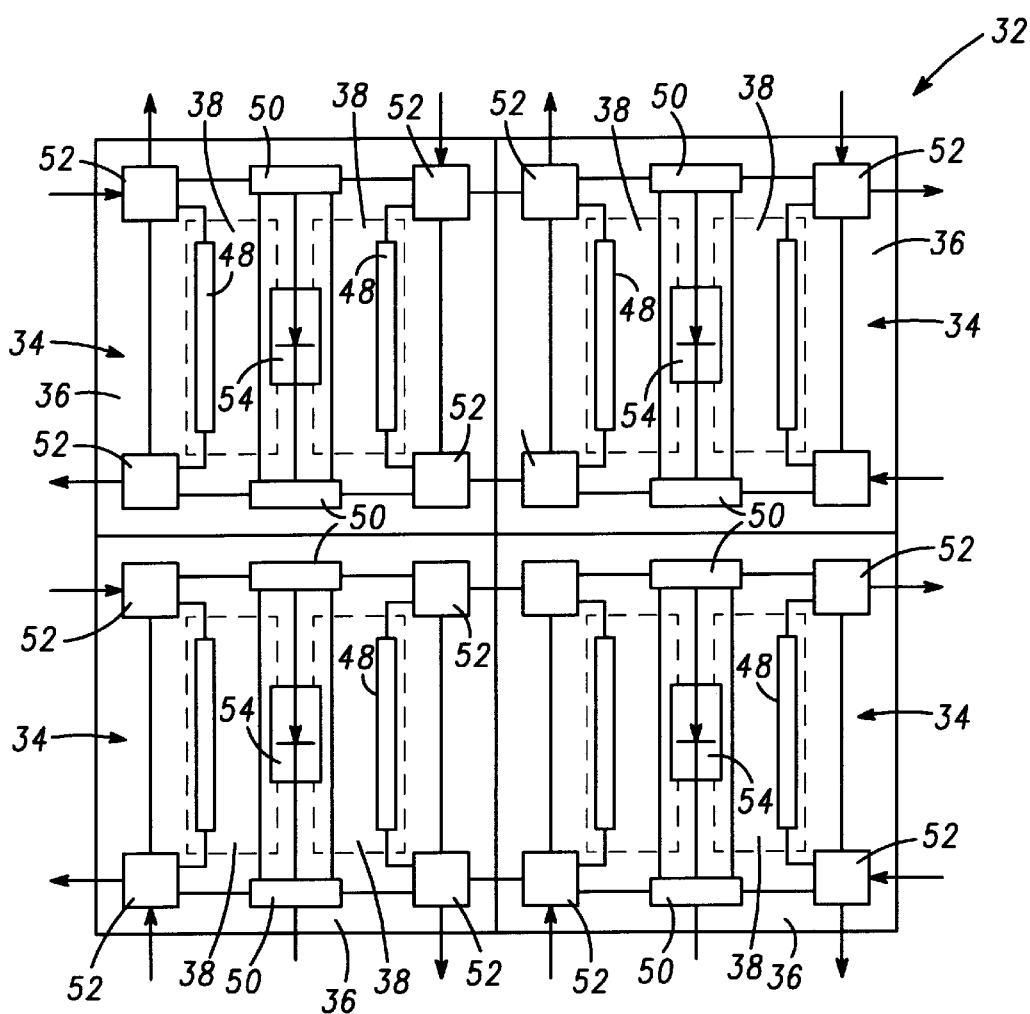
FIG. 2 generally depicts an array of thermoelectric cooler cells for controlling temperatures at active areas of the semiconductor device.

FIG. 2 shows an array 32 of thermoelectric cooler cells 34 which controls temperatures at electrically active areas of the semiconductor device 22. The individual thermoelectric cooler cells 34 each have respective thermoelectric coolers 32. The thermoelectric coolers 38 each have a designated cell area 36. Heat is selectively added to and removed from the cell areas associated with various ones of the thermoelectric cooler cells based on the electrical activity at the cell areas of the array 32.

FIG. 3 depicts a side view of thermoelectric coolers 38 for the cooler cells which transfer heat at respectively associated cell areas 36. The thermoelectric coolers 38 are made of n-doped semiconductor material 40 and p-doped semiconductor material 42. The n-doped 40 and p-doped semiconductor material 42 are connected together by electrical connection 44 and are positioned such that current is permitted to flow through the n-p junction 46. The n-doped 40 and p-doped 42 semiconductor material may selectively be arranged in layers or in thin-film blocks (as seen in FIG. 3). The n-doped and p-doped semiconductor materials 40, 42 are generally provided in a form of telluride (such as bimuth, antimony, or lead); silicon-germanium or bismuth-antimony. Other electrical connections 48 are shown which are coupled and provide communication with the electronic devices of the thermoelectric cooler cells 34.

Referring again to FIG. 2, electrical connections of four thermoelectric cooler cells 34 arranged in an array 32 are shown having memory devices 50, high-speed switches 52 and temperature-sensing devices 54. As seen in FIG. 2, each thermoelectric cell 34 has four high speed switches 52 which are coupled by connections 48 to the thermoelectric coolers 38 disposed at the semiconductor circuit 22. Each switch 52 is respectively associated with an individual one of the thermoelectric cooler cells 34 for selectively changing current flow direction in the thermoelectric coolers 38. At least one memory device 50 is associated with the thermoelectric cooler cells 34 for storing operational settings for the cooler cells. In the embodiment of FIG. 2, the memory device is a random access memory (RAM) 50 individually associated with and located at each thermoelectric cooler cell 34. Alternatively, the RAM 50 may selectively be located at a remote location from the thermoelectric cooler cells 34 to remotely store various operational data for the cells. The RAM 50 units are electrically coupled with the high-speed switches 52 connected with the thermoelectric coolers 38. The operational settings stored in RAM 50 include the switch settings of each of the associated high-speed switches 52 of the cells 34. The stored switch settings preferably include heat, cool and off settings.

The thermoelectric coolers 38 in the array 32 have an associated temperature-sensing element 54 for taking temperature measurements at each of the thermoelectric cooler cells 34. The temperature-sensing elements 54 provided may be any temperature sensor which is capable of determining temperature at local areas at the semiconductor material of the thermoelectric coolers 38. For instance, forward-biased, constant-current diodes etched onto the semiconductor material 40, 42 of the thermoelectric coolers 38 may be employed. Alternatively, temperature measurements may be determined by measuring the voltage across the n-p junction 46, FIG. 3, of the n-doped 40 and p-doped semiconductor material 42. The measured temperature is proportional to the voltage across an n-p device such as a diode when a constant current source is used across it. It will be appreciated that in most cases, the temperature is a linear function of the voltage.

As discussed above, the temperature-sensing elements 54, FIG. 2, RAM units 50 and the switches 32 are coupled with and interact with the controller 28. The temperature-sensing elements 54, FIG. 2, are coupled with the controller 28 to provide temperature measurements to the controller. The controller 28, which preferably is a programmable microprocessor based device, employs a genetic algorithm in a real time control application which utilizes the temperature measurements received at the controller. Based on the temperature measurements received which correspond to individual thermoelectric cooler cells 34 and their associated cell areas in the array 32, the controller 28 utilizing the genetic algorithm determines the current direction and current amount needed for each thermoelectric cooler cell 34 of the array 32 in order to minimize temperature variation at the semiconductor circuit 22. Genetic algorithm (GA) is used to optimize the independent parameters to maximize or minimize a given function described by the parameters. In controller 28, the genetic algorithm is used to minimize the average die temperatures of the semiconductor circuit device or to obtain the desired die temperature profile by controlling the on/off switching at selected thermoelectric cooler cells 34. The genetic algorithm uses the real time behavior of the apparatus (temperature distribution on the array) for given inputs to generate the optimum configuration for the thermoelectric coolers 38. In response to the temperature measurements received from the temperature-sensing elements 54, the controller 28 determines the switch setting (such as heat, cool, off) for the thermoelectric cooler cells 34 in the array 32. If the determined switch setting is different from the existing setting, the controller 28 selectively changes the switch setting stored in RAM 50 for the appropriate cooler cells 34. The high-speed switches 52 are appropriately switched in accordance with the stored switch settings and the array is accordingly activated.

In accordance with the invention, an array 32 of individually-controlled (preferably miniature) thermoelectric coolers 38 and disposed proximate, such that they are selectively adjacent or integrated with and co-located on the device dice of a semiconductor circuit such as an FPGA electronic device or sensor. A device die is preferably a semiconductor (such as from Si/SiC/GaAs) material layer having electronic circuitry integrated on the semiconductor material. The direction of current flow through the coolers 38 dictates whether the thermoelectric cooler "heats" or "cools". The current direction is controlled by high speed switches 52 having their settings stored in RAM 50. By changing the direction of the current, the individual thermoelectric coolers 38 effectively remove heat from a small area of the semiconductor based circuit or locally adds heat to the area proximate the semiconductor circuit.

The control of the array 32 of cells 34 is placed under controller 28 that takes temperature measurements from sensing elements 54 and then initiates heat, cool, or off switch settings in RAM 50 for each cell. The temperature data from the temperature-sensing elements 54 are used by the genetic algorithm (GA) based control system to efficiently control the thermoelectric coolers. The GA is utilized in a real time control application and uses the temperature information to determine the direction and the amount of current necessary for each thermoelectric cooler cell. The GA based control can reside on the controller 28 or can be user configurable and reside on an operating system of the semiconductor circuit itself.

This overcomes the problem of maintaining uniform temperatures on semiconductor based electronic devices in the presence of changing internal (FPGAs, central processing units, etc.) or external temperature (charged coupled display devices, infrared sensors etc.) by integrating a computer-controlled reconfigurable temperature monitoring controlling and cooling apparatus onto a semiconductor circuit during manufacturing. The present invention has many advantages over conventional thermal management techniques by providing: precise temperature control at sub-device level; small size and high reliability; the ability to locally heat or cool; efficiency with the areas which require cooling being cooled; the ability to be added at manufacturing stage; intelligent operation by controller responding to changes in local activity on the semiconductor based circuit.

FIG. 4A depicts an example of electrical activity occurring at the semiconductor circuit in relation to the cell areas 36 associated with the thermoelectric coolers of the array 32. The darker areas on the grid or array 32 reflect very active areas generating higher levels of heat and the generally clear areas reflect cooler areas having less activity or are inactive. The local temperatures on a semiconductor based device change due to inactivity (such as in the case of a CPU or FPGA) or an external field (CCD or IR Sensor). The temperature at each cell area 36 associated with a thermoelectric cooler cell is reported to the controller 28.

FIG. 4B depicts the thermoelectric cooler setting modes for the cell areas 36 of the array 32. The dark cell areas have their operational switch settings set to heat. The other cell areas 36 have their settings set to the cool or off modes. To establish an even temperature level throughout the array 32, heat settings are provided at relatively inactive areas while cool and off settings are generally provided in areas having high electrical activity. The controller 28 selectively determines switch settings for each thermoelectric cooler cell, depending on if there is a need to locally heat or cool the corresponding cell area 36.

FIG. 4C depicts the subsequent nearly-uniform temperature at the cell areas 36 of the array 32 disposed at the semiconductor circuit. Upon determining the proper switch settings, the controller 28 changes the necessary switch settings and the entire array 32 is activated. The dark areas represent hot areas and the clear areas represent cool areas. FIG. 4C illustrates the even and near-uniform distribution of heat across the entire array 32.

The thermoelectric coolers 38 are able to be integrated on a chip level of the semiconductor circuit 22 during manufacturing. The thermoelectric coolers 38 of the array 32 are selectively formed using materials such as metal suicides using metals such as Fe, Co, Cr, Mn or Ni. This provides for the formation of the cooling section, FIG. 1, on a silicon substrate of a semiconductor circuit. Alternatively, thin-film deposition techniques may be employed to form thermoelectric cooler cells, for instance such as on relatively larger sized multichip modules, or FPGAs having several discrete device dice on a substrate.

Figure 5A:
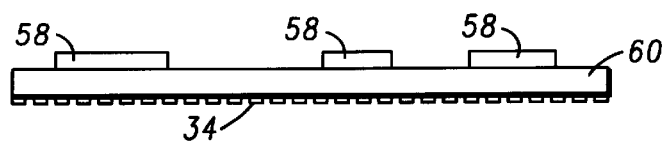
FIG. 5A depicts device die supported by a ceramic substrate with thermoelectric cooler cells in communication with the backside of the substrate.
Figure 5B:
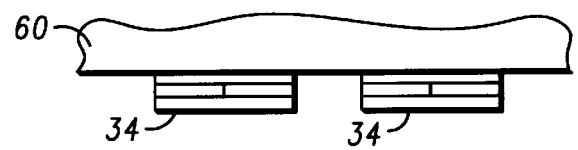
FIG. 5B illustrates an enlarged view of the cooler cells engaged with the ceramic substrate.
Figure 5C:
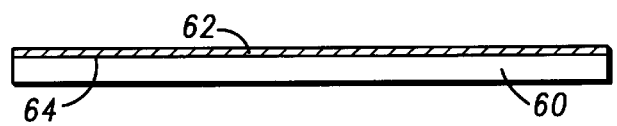
FIGS. 5C–5J depict steps of manufacture for thermoelectric coolers integrated on a substrate of a semiconductor device in accordance with the present invention.
Figure 5D:
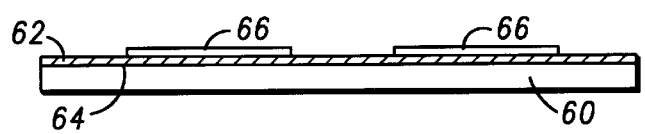
Figure 5E:
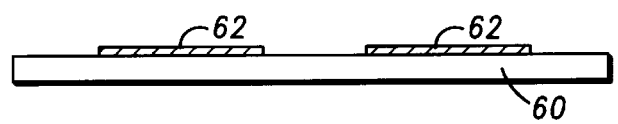
Figure 5F:
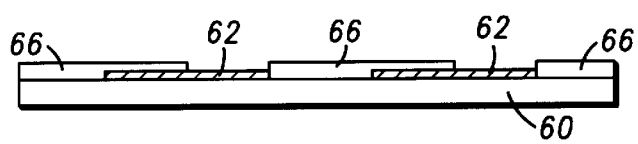
Figure 5G:
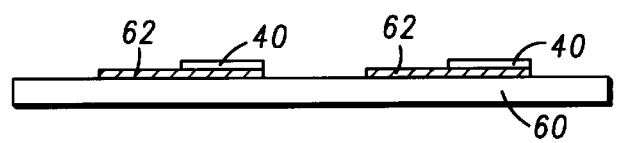
Figure 5H:
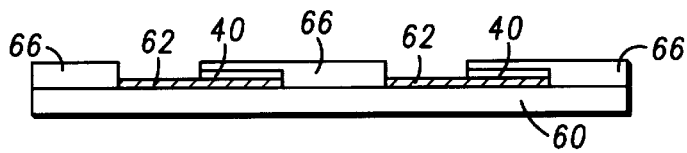
Figure 5I:
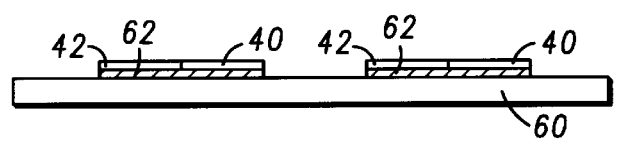
Figure 5J:
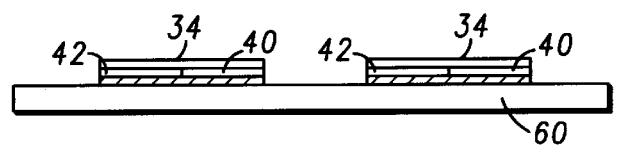

FIG. 5A illustrates device die being supported by ceramic substrate 60 with an array of thermoelectric cooler cells also in communication with the back side of ceramic substrate. FIG. 5B shows an enlarged view of the thermoelectric cooler cells 34 mounted to ceramic substrate 60 for a semiconductor device. As seen in FIGS. 5C–5J, thin-film multiple metal layers are deposited on organic or inorganic substrate materials which support the device dice. The manufacturing process using thin film technology techniques is depicted in FIGS. 5C–5J. Thermoelectric coolers are established on the back side of device die having a ceramic substrate 60 using the thin film manufacturing process. The preferred manufacturing process steps are as follows: (i) A layer of interconnect material 62 such as aluminum is deposited by sputter deposition technique on the semiconductor die 60 back side 64, FIG. 5C. (ii) A layer of resist material 66, FIG. 5D, is deposited on the interconnect layer 62 and a pattern of the areas forming the array of the thermoelectric coolers is generated. (iii) Using the wet etch process, the sputtered metals are removed, FIG. 5E, from areas where the resist material is not deposited. (iv) The resist layer is stripped exposing the interconnect layer 62. (v) Process steps (ii)–(iv) are repeated, FIGS. 5F–5G, to deposit the n or p material 40, 42 on the designated locations on the interconnect material layer. (vi) Process steps (ii)–(iv) are again repeated to deposit p or n material 42, 40 on the designated locations of the interconnect material layer as seen in FIGS. 5H–5I. (viii) Process steps (ii)–(iv) are repeated to deposit the top interconnect layers to complete the thermoelectric cooler cells 34, FIG. 5J, arranged in a preselected cell array.

Figure 6:
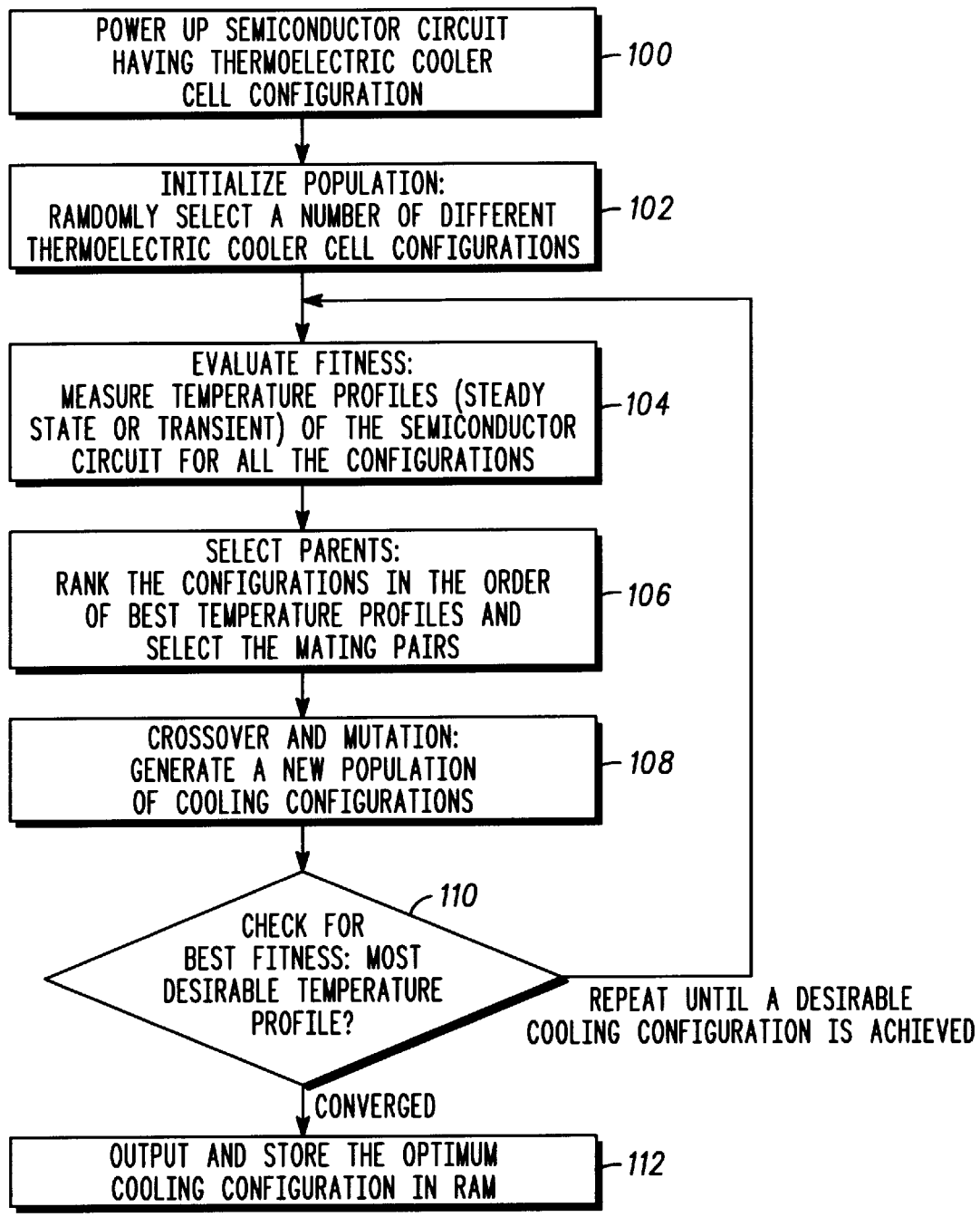
FIG. 6 depicts a flow chart illustrating the processing steps of a genetic algorithm in accordance with the present invention.

FIG. 6 depicts a flow chart illustrating the processing steps of the genetic algorithm (GA) at the controller 28 for the temperature monitoring and controlling apparatus 20 in accordance with the present invention. In step 100, the semiconductor circuit 22 (such as an FPGA) is powered up having the thermoelectric cooler cell configuration, preferably configured as in array 32. The population of thermoelectric cooler cells 34 is initialized in step 102. In step 102, a number (e.g., 10, 16, etc.) of different thermoelectric cooler cell configurations are randomly selected. Fitness evaluation is next performed in step 104 by measuring the temperature profiles (steady state or transient after preselected time intervals) of the semiconductor circuit 22 having the array 32 of cooler cells 34 for all the selected configurations. Preferably for the array 32, fitness=$(T_d-T_c)^2$ for all thermoelectric cooler cells 34, where $T_d$ is the desired temperature of a cooler cell and $T_c$ is the measured temperature of a cooler cell.

In step 106, selecting of parents is performed by ranking the configurations in the order of best temperature profiles and by selecting the mating pairs. Crossover and mutation is performed in step 108 by generating a new population of cooling configurations. In step 110, a check is made to determine the most desirable temperature processing. If the most desirable temperature profile is not found then the processing repeats until a desirable cooling configuration is achieved and the processing returns to step 104 to evaluate fitness. If the desired cooling configuration is met then the processing moves to step 112 in which the configuration settings are outputted and the optimum cooling configuration with associated settings are stored in RAM 50.

The present invention further provides a method of monitoring and controlling temperatures at the semiconductor circuit which includes the steps of: (1) positioning an array of thermoelectric cooler cells proximate the semiconductor circuit; (2) providing the array with thermoelectric coolers such that a thermoelectric cooler cell has an associated thermoelectric cooler for selectively removing heat from and adding heat to individual cell areas associated with the thermoelectric cooler cells; and (3) controlling operational settings for the thermoelectric cooler cells of the array to selectively add heat to and remove heat from the individual cell areas.

The method further includes the step of storing operational settings associated with each of the thermoelectric cooler cells. The array is provided with thermoelectric coolers with the step of positioning n-doped and p-doped semiconductor material at the thermoelectric coolers such that current is permitted to flow through the n-p junction of the n-doped and p-doped semiconductor material being accomplished. The step of changing current flow direction in selected ones of the thermoelectric coolers by selected ones of the high-speed switches is also accomplished.

Switch settings for the high-speed switches of the thermoelectric cooler cells are stored in RAM. The current flow direction is changed at selected ones of the thermoelectric coolers to alter the heat content at selected cell areas proximate the electronic device. Temperatures are increased at the thermoelectric cooler with temperature sensing elements positioned at the thermoelectric coolers cell. Alternatively, the taking of temperature measurements may include the step of measuring a voltage across the n-p junction of the n-doped and p-doped semiconductor material.

The temperature measurements from the thermoelectric cooler cells are reported to a controller coupled with the temperature-sensing elements. The step of determining the switch settings for the thermoelectric cooler cells in response to receipt of the temperature measurements is performed at the controller and the switch settings which are stored in RAM for selected ones of the thermoelectric cooler cells are changed. The controller then determines if selected ones of the thermoelectric coolers are needed to have the temperature locally changed at the cell areas associated with the thermoelectric coolers.

While the invention has been particularly shown and described with reference to particular embodiments, it will be understood by those skilled in the art that various changes in form and details may be made therein without departing from the spirit and scope of the invention, and it is intended that such changes come within the scope of the following claims.

What is claimed is:

1. An apparatus for monitoring and controlling temperatures at a semiconductor circuit comprising:
   an array of thermoelectric cooler cells disposed proximate the semiconductor circuit;
   a plurality of thermoelectric coolers with at least one thermoelectric cooler located at individual ones of the thermoelectric cooler cells for selectively removing and adding heat from a cell area associated with the thermoelectric cooler;
   a memory device associated with the thermoelectric cooler cells for storing operational settings for the thermoelectric cooler cells; and
   a controller coupled with the thermoelectric coolers for individually controlling the operational settings for the thermoelectric cooler cells of the array.

2. The apparatus of claim 1 wherein the thermoelectric coolers further include n-doped and p-doped semiconductor material positioned such that current is permitted to flow through an n-p junction.

3. The apparatus of claim 2 wherein the n-doped and p-doped semiconductor material is arranged in layers.

4. The apparatus of claim 2 wherein the n-doped and p-doped semiconductor material is arranged in thin-film blocks.

5. The apparatus of claim 2 wherein the semiconductor material is at least one of a) telluride, b) silicon-germanium and c) bismuth-antimony.

6. The apparatus of claim 2 wherein at least one high-speed switch is respectively associated with individual ones of the thermoelectric cooler cells for selectively changing current flow direction in the thermoelectric coolers.

7. The apparatus of claim 6 wherein the memory device is a random access memory (RAM) coupled with the high-speed switch associated with each thermoelectric cooler cell and wherein the operational settings stored in RAM include switch settings of the high-speed switch.

8. The apparatus of claim 7 wherein at least one RAM is individually located at each of the thermoelectric cooler cells.

9. The apparatus of claim 7 wherein the RAM is located remote from the thermoelectric cooler cells.

10. The apparatus of claim 7 wherein the switch settings include heat, cool and off settings.

11. The apparatus of claim 7 including means for changing the current flow direction for selected ones of the thermoelectric coolers to alter heat content at the cell area associated with the selected ones of the thermoelectric coolers.

12. The apparatus of claim 7 wherein each thermoelectric cooler has an associated temperature-sensing element for taking temperature measurements at each thermoelectric cooler cell.

13. The apparatus at claim 12 wherein the temperature-sensing element includes forward-biased, constant-current diodes etched onto the semiconductor material of the thermoelectric coolers.

14. The apparatus of claim 12 wherein the temperature-sensing element is coupled with the controller and provides temperature measurements to the controller.

15. The apparatus of claim 14 wherein the controller determines the switch setting for each thermoelectric cooler cell in response to the temperature measurements received from the temperature-sensing element.

16. The apparatus of claim 15 wherein the controller selectively changes the switch settings stored in RAM for the thermoelectric cooler cells.

17. The apparatus of claim 16 wherein the controller employs a genetic algorithm in a real time control application which utilizes the temperature measurements received at the controller to determine a current direction and current amount needed for each thermoelectric cooler cell in order to minimize temperature variation at the semiconductor circuit.

18. The apparatus of claim 17 wherein the controller is an external microprocessor coupled with the temperature-sensing element, the RAM and high speed switch for each of the thermoelectric cooler cells.

19. A method of monitoring and controlling temperatures at a semiconductor circuit comprising the steps of:

positioning an array of a plurality of thermoelectric cooler cells proximate the semiconductor circuit;

providing the array with a plurality of thermoelectric coolers such that a thermoelectric cooler cell has an associated thermoelectric cooler for selectively removing and adding heat from individual cell areas associated with the thermoelectric cooler cells; and controlling operational settings for the thermoelectric cooler cells of the array to selectively add and remove heat from the individual cell areas.

20. The method of claim 19 wherein the step of controlling operational settings for the thermoelectric cooler cells comprises the step of storing operational settings associated with each of the thermoelectric cooler cells.

21. The method of claim 20 wherein the step of providing the array with thermoelectric coolers comprises the step of positioning n-doped and p-doped semiconductor material at the thermoelectric coolers such that current is permitted to flow through an n-p junction of the n-doped and p-doped semiconductor material.

22. The method of claim 21 wherein the array of thermoelectric cooler cells includes a plurality of high speed switches with each of the thermoelectric cooler cells having at least one associated with high-speed switch and wherein the step of controlling comprises the step of changing current flow direction in selected ones of the thermoelectric coolers by selected ones of the high-speed switches.

23. The method of claim 22 wherein the step of controlling comprises the step of storing in random access memory (RAM), switch settings for the high-speed switches of the thermoelectric cooler cells.

24. The method of claim 23 wherein the switch settings include heat, cool and off settings.

25. The method of claim 23 wherein the step of controlling comprises the step of changing the current flow direction at selected ones of the thermoelectric coolers to alter the heat content at selected cell areas proximate the electronic device.

26. The method of claim 25 wherein the step of controlling comprises the step of taking temperature measurements at the thermoelectric cooler.

27. The method of claim 26 wherein the step of taking temperature measurements comprises the step of measuring temperatures at the thermoelectric cooler with temperature sensing elements positioned at the thermoelectric coolers cell.

28. The method of claim 26 wherein the step of taking temperature measurements comprises the step of measuring a voltage across the n-p junction of the n-doped and p-doped semiconductor material.

29. The method of claim 26 wherein the step of controlling comprises the step of reporting temperature measurements from the thermoelectric cooler cells to a controller coupled with the temperature-sensing elements.

30. The method of claim 29 wherein the step of controlling comprises the step of determining the switch settings for the thermoelectric cooler cells in response to receipt of the temperature measurements.

31. The method of claim 30 wherein the step of controlling comprises the step of changing the switch settings stored in RAM for selected ones of the thermoelectric cooler cells.

32. The method of claim 31 wherein the step of controlling comprises the step of determining if selected ones of the thermoelectric coolers are needed to locally change the temperatures at cell areas associated with the thermoelectric coolers.

33. The method of claim 19 wherein the step of controlling comprises the step of operating at the controller a genetic algorithm which utilizes the temperature measurements received at the controller to determine current direction and current amount required the thermoelectric cooler cells to minimize temperature variation at the cell areas.

* * * * *